USS008674424B2

United States Patent
Yan et al.

(10) Patent No.: US 8,674,424 B2
(45) Date of Patent: Mar. 18, 2014

(54) MEMORY DEVICE WITH CHARGE STORAGE LAYERS AT THE SIDEWALLS OF THE GATE AND METHOD FOR FABRICATING THE SAME

(75) Inventors: Shih-Guei Yan, Hsinchu (TW); Wen-Jer Tsai, Hsinchu (TW); Chih-Chieh Cheng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 15 days.

(21) Appl. No.: 13/304,378

(22) Filed: Nov. 24, 2011

(65) Prior Publication Data

US 2013/0134497 A1 May 30, 2013

(51) Int. Cl.
*H01L 29/76* (2006.01)
*H01L 21/8238* (2006.01)

(52) U.S. Cl.
USPC ........ 257/314; 257/E29.3; 438/201; 438/211; 438/257

(58) Field of Classification Search
USPC ............ 257/288, 411, 410, 324, 405, E21.21, 257/E21.423, E29.255, E21.205, E21.18, 257/E21.679, E27.078, E29.309, E29.316, 257/E21.395, 314, E29.3; 438/216, 261, 438/591, 593, 201, 211, 257
See application file for complete search history.

(56) References Cited

U.S. PATENT DOCUMENTS

| 7,329,914 | B2 | 2/2008 | Shih | |
|---|---|---|---|---|
| 7,402,490 | B2 | 7/2008 | Mikolajick et al. | |
| 2002/0045319 | A1* | 4/2002 | Ogura et al. | 438/303 |
| 2004/0245564 | A1* | 12/2004 | Ogura et al. | 257/315 |
| 2006/0186480 | A1* | 8/2006 | Seidl et al. | 257/369 |
| 2009/0032864 | A1 | 2/2009 | Inoue | |

\* cited by examiner

*Primary Examiner* — Selim Ahmed
(74) *Attorney, Agent, or Firm* — Jianq Chyun IP Office (57) ABSTRACT

A memory device is described, including a gate over a substrate, a gate dielectric between the gate and the substrate, and two charge storage layers. The width of the gate is greater than that of the gate dielectric, so that two gaps are present at both sides of the gate dielectric and between the gate and the substrate. Each charge storage layer includes a body portion in one of the gaps, a first extension portion connected with the body portion and protruding out of the corresponding sidewall of the gate, and a second extension portion connected to the first extension portion and extending along the sidewall of the gate, wherein the edge of the first extension portion protrudes from the sidewall of the second extension portion.

9 Claims, 5 Drawing Sheets

FIG. 10 (RELTAED ART)

MEMORY DEVICE WITH CHARGE STORAGE LAYERS AT THE SIDEWALLS OF THE GATE AND METHOD FOR FABRICATING THE SAME

BACKGROUND OF THE INVENTION

1. Field of the Invention

This invention relates to an integrated circuit (IC) device and fabrication thereof, and more particularly relates to a memory device and a method for fabricating the same.

2. Description of Related Art

A memory is a semiconductor device for storing information or data. As the computer microprocessors become more and more powerful, programs and operations executed by the software are increased correspondingly. Consequentially, the demand for high storage capacity memories is getting more.

Among various types of memory products, a non-volatile memory allows multi-time data programming, reading and erasing operations, and the data stored therein can be retained even after the power to the memory is terminated. With these advantages, the non-volatile memory has become one of the most widely adopted memories for personal computers and electronic equipment.

Electrically programmable and erasable non-volatile memory technologies based on charge storage structures and known as Electrically Erasable Programmable Read-Only Memory (EEPROM) and flash memory are used in various modern applications. A flash memory is designed with an array of memory cells that can be independently programmed and read. Traditional flash memory cells store charges in a floating gate, but another type of flash memory uses a charge-trapping structure, such as a layer of non-conductive SiN material, instead of a floating gate including a conductive material. When a charge-trapping cell is programmed, charges are trapped and do not move through the non-conductive layer. The charges are retained by the charge trapping layer until the cell is erased, retaining the data state without continuously applied electrical power. Charge-trapping cells can be operated as two-sided cells. That is, because the charges do not move through the non-conductive charge trapping layer, the charges can be localized on different charge-trapping sites. On the other words, in the flash memory devices with the use of the charge-trapping structure, more than one bit of information is stored in each memory cell.

A single memory cell can be programmed to store two physically separated bits in the trapping structure, in the form of a concentration of charges near the source and another concentration of charges near the drain. Programming of the memory cell can be performed by Channel Hot Electron (CHE) injection, which generates hot electrons in the channel region. Some of the hot electrons gain enough energy to be trapped in the charge-trapping structure. By interchanging the biases applied to the source and drain terminals, charges are trapped either in a portion of the charge-trapping structure near the source region, near the drain region, or both.

Usually, one of four distinct combinations of bits 00, 01, 10 and 11 can be stored in a memory cell having a charge-trapping structure, wherein each combination has a corresponding threshold voltage (Vt). In a read operation, the current flowing through the memory cell varies depending upon the Vt of the cell. Typically, such current has one of four different values each corresponding to a different Vt. Accordingly, by sensing such current, the particular bit combination stored in the cell is determined.

The total available charge range or Vt range may be referred to as the memory operation window. In other words, the memory operation window is defined by the difference between the program level and the erase level. A large memory operation window is desired as good level separation between states is needed for cell operation. The performance of two-bit memory cells, however, is often degraded by the so-called "second bit effect" in which localized charges in the charge-trapping structure interact with each other. For example, during a reverse read operation, a read bias is applied to the drain terminal and the charge stored near the source region (i.e., a "first bit") is sensed, then the bit near the drain region (i.e., the "second bit"), however, creates a potential barrier for reading the first bit near the source region. This barrier may be overcome by applying a bias with a suitable magnitude, using the drain-induced barrier lowering (DIBL) effect to suppress the effect of the second bit near the drain region and allow the sensing of the storage status of the first bit. However, when the second bit near the drain region is programmed to a high Vt state and the first bit near the source region is at un-programmed state, the second bit raises this barrier substantially. Thus, as the Vt associated with the second bit increases, the read bias for the first bit becomes insufficient to overcome the potential barrier created thereby, and the Vt associated with the first bit is raised as a result of the higher Vt of the second bit reducing the memory operation window. The second bit effect decreases the memory operation window for 2-bit/cell operation, so there is a need for methods and devices capable of suppressing the second bit effect in memory devices.

SUMMARY OF THE INVENTION

Accordingly, this invention provides a memory device that has a well confined charge storage region so that the charges stored are fully localized to reduce the second-bit effect, minimize program disturbance behaviors and reduce the short channel effect.

This invention also provides a method for fabricating a memory device, which utilizes few steps to allow the fabricated memory device to have a well confined charge storage region, so that the charges stored are fully localized to reduce the second-bit effect, minimize program disturbance behaviors and reduce the short channel effect.

In a first aspect of this invention, the memory device includes a gate over a substrate, a gate dielectric between the gate and the substrate, and two charge storage layers. Two gaps are present at both sides of the gate dielectric and between the gate and the substrate. Each charge storage layer includes a body portion in one of the gaps, a first extension portion connected with the body portion and protruding out of the corresponding sidewall of the gate, and a second extension portion connected to the first extension portion and extending along the sidewall of the gate, wherein the edge of the first extension portion protrudes from the sidewall of the second extension portion.

In an embodiment, the body portions, the first extension portions and the second extension portions of the charge storage layer comprise the same material.

In an embodiment, the memory device further includes two doped regions in the substrate at both sides of the gate, wherein the first and the second extension portions of each charge storage layer are located over one of the doped regions.

In an embodiment, the memory device further includes two liner layers and two spacer layers. Each of the liner layers is between the gate and the second extension portion of one of the charge storage layers. The two spacer layers are disposed over the edges of the first extension portions of the charge storage layers, wherein the second extension portion of each charge storage layer is between one of the liner layers and one of the spacer layers.

In an embodiment, the ratio of the length of the body portion to that of the first extension portion ranges from 2:1 to 5:1.

In a second aspect of this invention, the memory device includes the above gate and gate dielectric, and two charge storage layers and two liner layers. Each charge storage layer includes a body portion in one of the gaps, and an extension portion connected with the body portion and protruding out of the corresponding sidewall of the gate. The two liner layers are disposed on the sidewalls of the gate, wherein the edge of the extension portion of each charge storage layer protrudes out of the sidewall of one of the liner layers.

In an embodiment, the above memory device further includes two doped regions in the substrate at both sides of the gate, wherein the extension portion of each charge storage layer extends to over one of the doped regions.

In an embodiment, the ratio of the length of the body portion to that of the extension portion ranges from 2:1 to 5:1.

In a third aspect of this invention, the memory device includes the above gate, the above gate dielectric, two above charge storage layers each including a body portion and an extension portion, and two doped regions in the substrate at both sides of the gate. The extension portion of each charge storage layer extends to over one of the doped regions.

The method for fabricating a memory device is described as follows. A gate dielectric and a gate thereon are formed on a substrate, wherein two gaps are formed at both sides of the gate dielectric and between the gate and the substrate. Two charge storage layers are formed, each including a body portion in one of the gaps, and a first extension portion connected with the body portion and protruding out of the corresponding sidewall of the gate. Two doped regions are formed in the substrate at both sides of the gate, wherein the first extension portion of each charge storage layer extends to over one of the doped regions.

In an embodiment, each charge storage layer further includes a second extension portion connected to the first extension portion and extending along the corresponding sidewall of the gate, wherein the edge of the first extension portion protrudes from the sidewall of the second extension portion.

In an embodiment, the above method further includes forming, before the charge storage layers are formed, a liner material layer covering a surface of the substrate, the sidewalls of the gate dielectric, and a bottom, the sidewalls and the upper surface of the gate, such that after the charge storage layers are formed, the edge of the first extension portion of each charge storage layer protrudes out of the liner material layer on the corresponding sidewall of the gate.

In an embodiment, forming the charge storage layers includes the steps below. A charge storage material layer is formed on the liner material layer, filling the gaps. A spacer material layer is formed covering the charge storage material layer. The spacer material layer, the charge storage material layer and the liner material layer are anisotropically etched to exposes surfaces of the gate and the substrate, wherein the remaining spacer material layer, the remaining charge storage material layer and the remaining liner material layer serve as spacer layers, the charge storage layers and liner layers, respectively.

In an embodiment, the first extension portion and the second extension portion of each charge storage layer are located over one of the doped regions.

In an embodiment, the method further includes forming liner layers on the sidewalls of the gate, wherein the first extension portion of each charge storage layer protrudes out of the sidewall of a liner layer.

Since the body portions of the two charge storage layers are separated from each other, the memory device of this invention has two well confined charge storage regions so that the charges stored are fully localized to reduce the second-bit effect, minimize the program disturbance behaviors and reduce the short channel effect. Such structure of the charge storage layers can be made by a simple process in the fabricating method of this invention.

In order to make the aforementioned and other features and advantages of the invention more comprehensible, several embodiments accompanied with figures are described in detail below.

DESCRIPTION OF EMBODIMENTS

The following embodiment is intended to further explain this invention, but is not intended to restrict the scope of this invention.

FIGS. 1-7 illustrate, in a cross-sectional view, a method for fabricating a memory device according to an embodiment of this invention.

Figure 1:
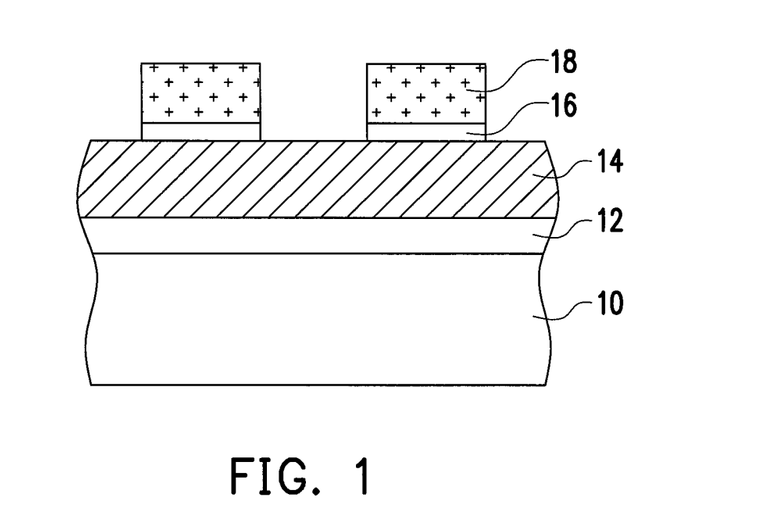
FIGS. 1-7 illustrate, in a cross-sectional view, a method for fabricating a memory device according to an embodiment of this invention.

Referring to FIG. 1, a gate dielectric 12 is formed on a substrate 10, and then a gate conductive layer 14 is formed on the gate dielectric 12. The substrate 10 may include a semiconductor material, such as bulk silicon or silicon on insulator (SOI), or a semiconductor compound. The gate dielectric 12 may include silicon oxide or other suitable material, and may be formed by thermal oxidation, CVD or other suitable method. The gate conductive layer 14 may include doped poly-Si, and may be formed by depositing undoped poly-Si through CVD and ion-implanting the same, or by poly-Si CVD with in-situ doping.

Then, a patterned hard mask layer 16 and a patterned mask layer 18 are formed on the gate conductive layer 14. The hard mask layer 16 may include an advanced patterning film (APF), and may be formed by CVD. The patterned mask layer 18 may included a photoresist material. The patterns of the mask layer 18 can be formed through exposure and development, and the patterns of the hard mask layer 16 can be transferred from the mask layer 18.

Figure 2:
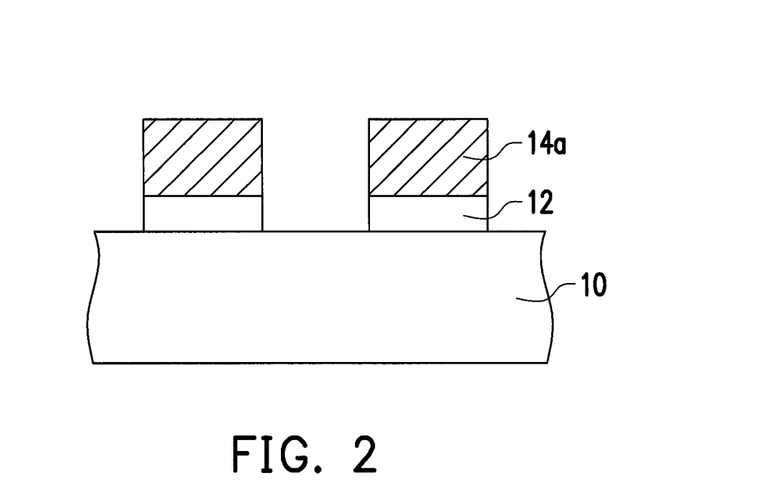

Referring to FIG. 2, an etching process is performed, with the patterned mask layer 18 and the hard mask layer 16 as a mask and the substrate 10 as an etching end, to pattern the gate conductive layer 14 into a plurality of gates 14a and successively pattern the gate dielectric 12. The etching process may be an anisotropic etching process. The anisotropic etching process may be a plasma etching process. Then, the patterned mask layer 18 and the patterned hard mask layer 16 are removed.

Figure 3:
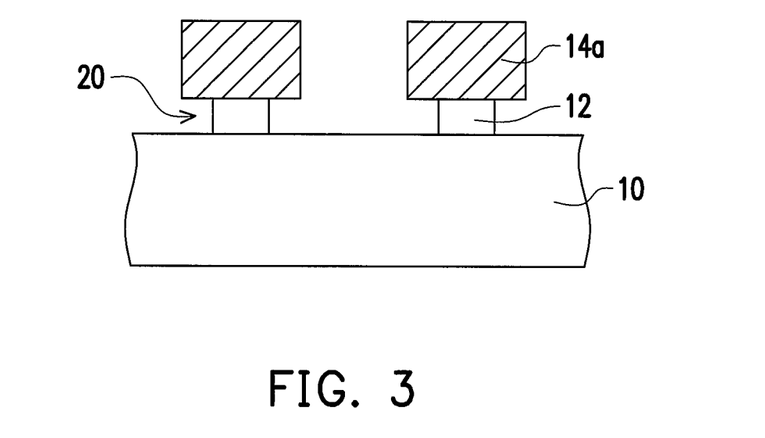

Referring to FIG. 3, an isotropic etching process is performed to remove a portion of the gate dielectric 12 and produce an undercut under the gate 14a, so that two recesses 20 are formed at both sides of the gate dielectric 12 under the gate 14a as local storage spaces.

Figure 4:
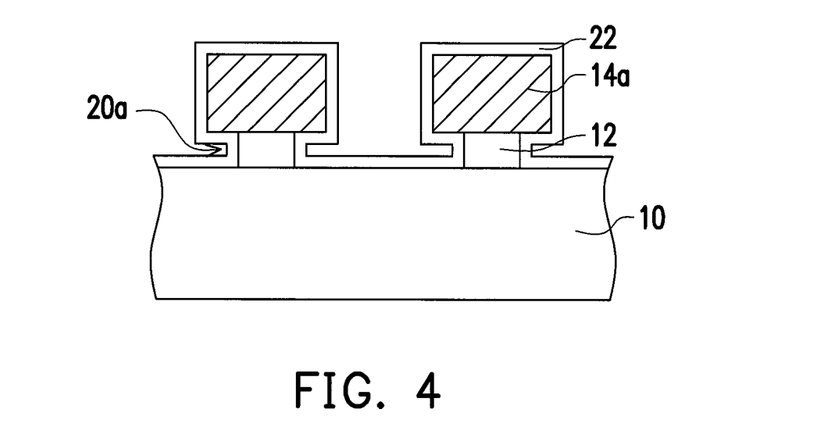

Referring to FIG. 4, a liner material layer 22 is formed covering the top surface, the sidewalls and the exposed bottoms of each gate 14a, the sidewalls of the gate dielectric 12, and the exposed surfaces of the substrate 10. In an embodiment, the liner material layer 22 conformally covers the top surface, the sidewalls and the exposed bottoms of each gate 14a, the sidewalls of the gate dielectric 12, and the exposed surfaces of the substrate 10. The liner material layer 22 fills in the recesses 20 shown in FIG. 3 but does not fill up the same, so that two gaps 20a (FIG. 4) remain in the recesses 20. The liner material layer 22 may include silicon oxide, may be formed through thermal oxidation, ISSG (in-situ steam generation) oxidation, CVD, atomic layer deposition (ALD) or furnace oxidation.

Figure 5:
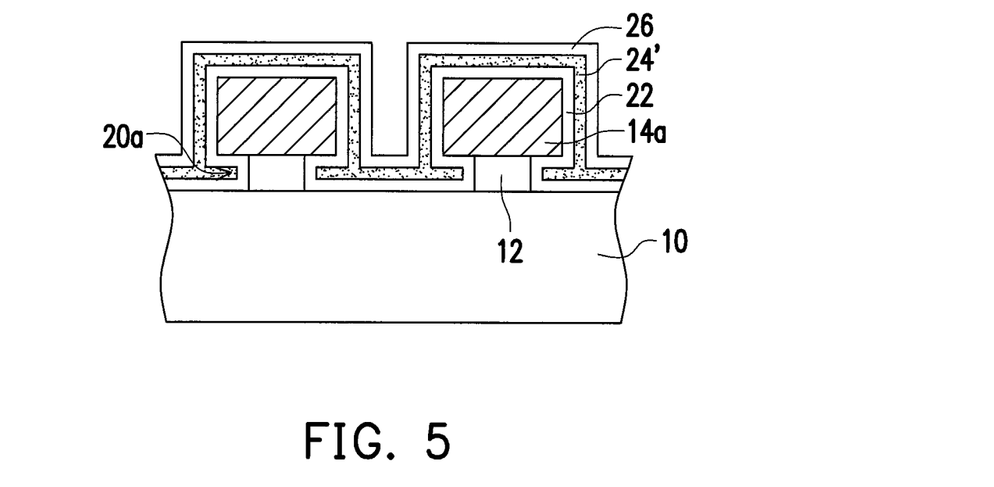

Referring to FIG. 5, a charge storage material layer 24' is formed, covering the liner material layer 22 on the top surfaces and the sidewalls of each gate 14a and on the substrate 10, and filling the gaps 20a. The charge storage material layer 24' may include silicon nitride (SiN) or doped poly-Si. SiN may be formed through furnace deposition, LPCVD or ALD. Doped poly-Si may be formed by poly-Si CVD with in-situ doping.

Then, a spacer material layer 26 is formed covering the charge storage material layer 24' on the top surfaces and the sidewalls of each gate 14a and over the substrate 10. In an embodiment, the spacer material layer 26 is conformal to the charge storage material layer 24' on the top surfaces and the sidewalls of each gate 14a and over the substrate 10. The spacer material layer 26 may include silicon oxide, may be formed through furnace oxidation, CVD or high-temperature thermal oxidation.

Figure 6:
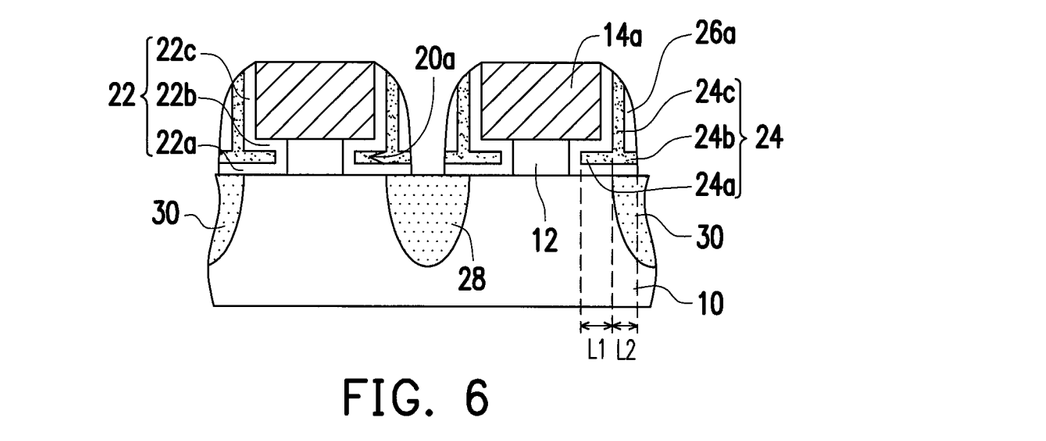

Referring to FIG. 6, the spacer material layer 26, the charge storage material layer 24 and the liner material layer 22 are anisotropically etched such that the top surface of each gate 14a and surfaces of the substrate 10 are exposed. The remaining charge storage material layer 24' serves as a plurality of charge storage layers 24, each of which includes a body portion 24a in one of the gaps 20a, a first extension portion 24b connected with the body portion 24a and protruding out of the corresponding sidewall of the gate 14a, and a second extension portion 24c disposed on the sidewall of the gate 14a and extending down to connect with the first extension portion 24b, wherein the edge of the first extension portion 24b protrudes from the sidewall of the second extension portion 24c.

The remaining liner material layer 22 includes three portions 22a, 22b and 22c. The first portion 22a of the liner material layer 22 is between the substrate 10 and the charge storage layer 24, serving as a tunneling dielectric layer. The second portion 22b of the liner material layer 22 is between the gate 14a and the body portion 24a of the charge storage layer 24, serving as a top dielectric layer. The third portion 22c of the liner material layer 22 is on the sidewall of the gate 14a, and is between the gate 14a and the second extension portion 24c of the charge storage layer 24 to serve as a liner layer. The remaining spacer material layer serves as spacer layers 26a, each of which is located on the edge of the first extension portion 24b of one of the charge storage layers 24 and on the sidewall of the corresponding second extension portion 24c.

Thereafter, an ion-implantation process is performed to form doped regions 28 and 30 in the substrate 10 at both sides of the gate 14a, wherein the first extension portions 24b and the second extension portions 24c of the charge storage layers 24 are located over the doped regions 28 and 30. The dopant implanted in the dope region 28 and the dopant implanted in the doped region 30 have the same conductivity type, which is different from the conductivity type of the substrate 10. In an embodiment, the substrate 10 is P-doped and the doped regions 28 and 30 are N-doped. In another embodiment, the substrate 10 is N-doped and the doped regions 28 and 30 are P-doped. The N-type dopant may be phosphorus or arsenic. The P-type dopant may be boron or boron difluoride. The doped regions 28 and 30 can serve as a source region and a drain region of a memory cell.

Figure 7:
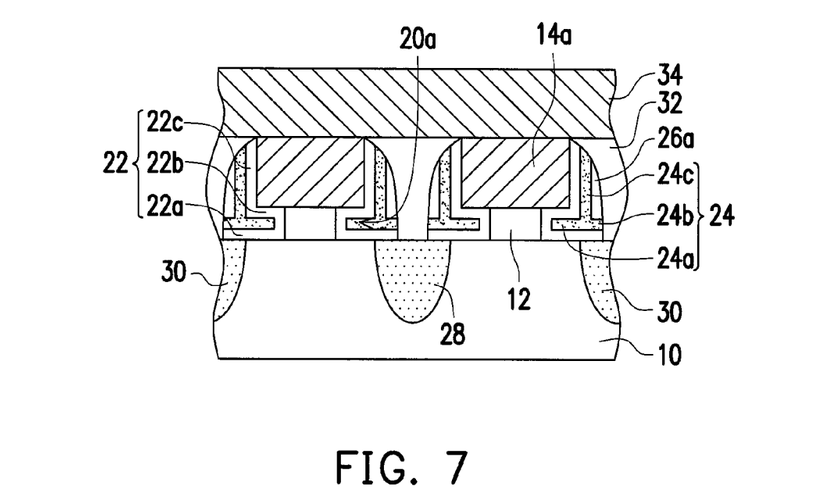

Referring to FIG. 7, a dielectric layer 32 is formed over the substrate 10, filling up the gaps between the gates 14a and exposing the top surfaces of the gates 14a. The dielectric layer 32 may include silicon oxide, and may be formed by depositing a dielectric material layer through CVD and then planarizing the same. The planarization process may include etching-back or CMP.

Then, a word line 34 is formed on the dielectric layer 32 and on the top surfaces of the gates 14a. The word line 34 includes a conductive material, and is electrically connected with the gates 14a. In an embodiment, the extension direction of the word line 34 is different from that of the doped regions 28 and 30, and may be perpendicular to the latter. The word line 34 may be formed by depositing a conductive material layer and then patterning the same through lithography and etching. The conductive material may be doped poly-Si, metal, metal alloy, or a combination thereof. Doped poly-Si may be formed by poly-Si CVD with in-situ doping. The metal or metal alloy may be formed by sputtering or CVD, or other suitable method.

Referring to FIG. 7 again, the memory device according to the above embodiment of this invention includes a gate 14a, a gate dielectric 12, two charge storage layers 24, two doped regions 28 and 30, and a word line 34.

The gate 14a is disposed on the substrate 10. The gate dielectric 12 is between the gate 14a and the substrate 10. The width of the gate dielectric 12 is smaller than that of the gate 14a in a symmetric manner, so that two gaps 20a are present at both sides of the gate dielectric 12 and between the gate 14a and the substrate 10.

The material of the two charge storage layers 24 is different from that of the gate dielectric 12. Each charge storage layer 24 includes a body portion 24a in one of the gaps 20a, a first extension portion 24b connected with the body portion 24a and protruding out of the corresponding sidewall of the gate 14a, and a second extension portion 24c connected with the first extension portion 24b and extending upward along the sidewall of the gate 14a, wherein the edge of the first extension portion 24b protrudes from the sidewall of the second extension portion 24c. Thus, each charge storage layer 24 has an inversed T-shape. When the length L1 of the body portion 24a is too short, the programming efficiency is limited. When the length L1 of the body portion 24a is larger, the programming speed is higher but the second-bit effect gets greater. When the length of the first extension portion 24b is larger, the control thereof by the gate 14a is weaker so that the second-bit effect is smaller, but the programming speed still can be improved. The length L1 of the body portion 24a may be 50-150 angstroms, and the length L2 of the first extension portion 24b may be 10-75 angstroms. In an embodiment, the ratio of the length of the body portion 24a to that of the first extension portion 24b ranges from 2:1 to 5:1. The body portions 24a, the first extension portions 24b and the second extension portions 24c of the charge storage layers 24 may include the same material.

The tunneling dielectric layer 22a is disposed between the charge storage layer 24 and the substrate 10. The top dielectric layer 22b is disposed under the gate 14a and is between the gate 14a and the body portion 24a of the charge storage layer 24. The liner layer 22c is disposed on a sidewall of the gate 14a and between the gate 14a and the second extension portion 24c of the charge storage layer 24. The spacer layer 26a is disposed on the edge of the first extension portion 24b of the charge storage layer 24 and on the sidewall of the second extension portion 24c. In an embodiment, the material of the tunneling dielectric layers 22a, the top dielectric layers 22b, the liner layers 22c and the spacer layers 26a is different from that of the charge storage layer 24.

The doped regions 28 and 30 are located in the substrate 10 at both sides of the gate 14a, wherein the first extension portions 24b and the second extension portions 24c of the charge storage layers 24 are located over the doped regions 28 and 30. The dopant implanted in the dope region 28 and the dopant implanted in the doped region 30 have the same conductivity type, which is different from the conductivity type of the substrate 10.

Figure 8:
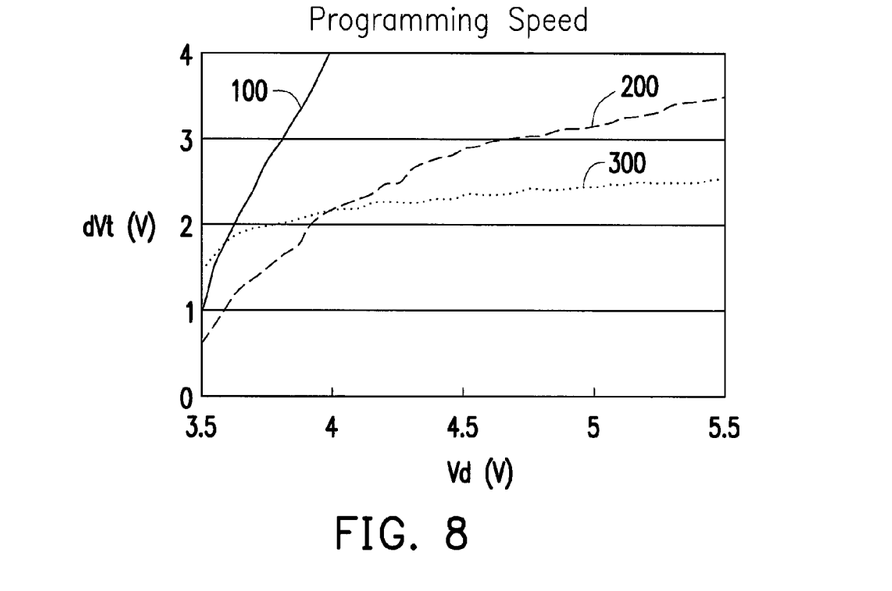
FIG. 8 shows the variations of the programming speed with the drain voltage for three different memory devices according to the embodiments of this invention.

FIG. 8 shows the variations of the programming speed with the drain voltage (Vd) for three different memory devices according to the embodiments of this invention, wherein dVt means the Vt-increasing rate of the programmed bit.

Figure 9:
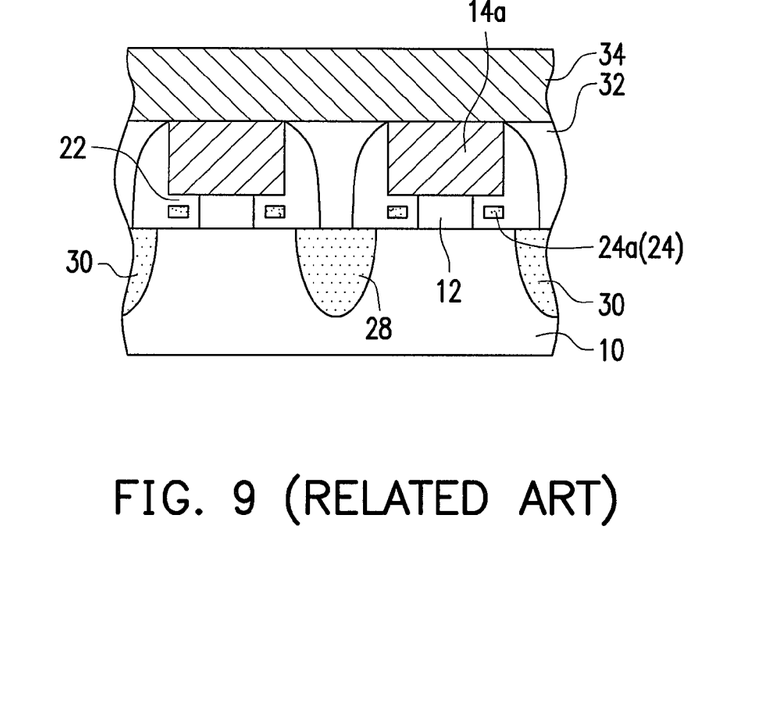
FIGS. 9-10 illustrate, in a cross-sectional view, two memory devices in the prior art.
Figure 10:
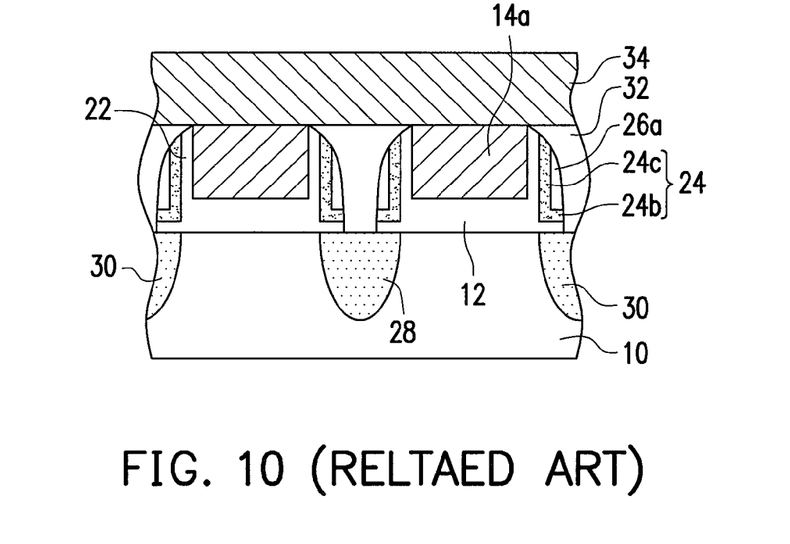

Referring to FIG. 8, the curve 100 is the result of programming the memory device of the embodiment shown in FIG. 7 that includes an inversed T-shaped charge storage layer 24 including the body portion 24a, the first extension portion 24b and the second extension portion 24c. The curve 200 is the result of programming the prior-art memory device shown in FIG. 9 that includes a charge storage layer 24 including the body portion 24a only. The curve 300 is the result of programming the prior-art memory device shown in FIG. 10 that includes an L-shaped charge storage layer 24 including the first extension portion 24b and the second extension portion 24c only. It is clear from FIG. 8 that when the drain voltage for programming is the same, the memory with an inversed T-shaped charge storage layer (corresponding to curve 100) has a higher Vt-increasing rate (dVt), i.e., a higher programming speed.

Since the body portions of the two charge storage layers are separated from each other, the memory device of this invention has two well confined charge storage regions so that the charges stored are fully localized to reduce the second-bit effect, minimize the program disturbance behaviors and reduce the short channel effect. Such structure of the charge storage layers can be made by a simple process in the fabricating method of this invention.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A memory device, comprising:
a gate over a substrate;
a gate dielectric between the gate and the substrate, wherein two gaps are present at both sides of the gate dielectric and between the gate and the substrate;
two charge storage layers, each including a body portion in one of the gaps, a first extension portion connected with the body portion and protruding out of a sidewall of the gate, and a second extension portion connected to the first extension portion and extending along the sidewall of the gate, wherein an edge of the first extension portion protrudes from a sidewall of the second extension portion, and a ratio of a length of the body portion to a length of the first extension portion ranges from 2:1 to 5:1;
two doped regions in the substrate at both sides of the gate, wherein the first extension portion and the second extension portion of each charge storage layer are located over one of the doped regions; and
a word line connecting the gate of the memory device to a gate of another memory device and covering at least one of the two doped regions.

2. The memory device of claim 1, further comprising:
two liner layers each between the gate and the second extension portion of one of the charge storage layers; and
two spacer layers over the first extension portions of the charge storage layers, wherein the second extension portion of each charge storage layer is between one of the liner layers and one of the spacer layers.

3. A memory device, comprising:
a gate over a substrate;
a gate dielectric between the gate and the substrate, wherein two gaps are present at both sides of the gate dielectric and between the gate and the substrate;
two charge storage layers, each including a body portion in one of the gaps, and an extension portion connected with the body portion and protruding out of a sidewall of the gate, wherein a ratio of a length of the body portion to a length of the extension portion ranges from 2:1 to 5:1;
two liner layers on the sidewalls of the gate, wherein an edge of the extension portion of each charge storage layer protrudes out of a sidewall of one of the liner layers;
two doped regions in the substrate at both sides of the gate, wherein the extension portion of each charge storage layer extends to over one of the doped regions; and
a word line connecting the gate of the memory device to a gate of another memory device and covering at least one of the two doped regions.

4. A method for fabricating a memory device, comprising:
forming a gate dielectric on a substrate and a gate on the gate dielectric, wherein two gaps are formed at both sides of the gate dielectric and between the gate and the substrate;
forming two charge storage layers, wherein each charge storage layer includes a body portion in one of the gaps, and a first extension portion connected with the body portion and protruding out of a sidewall of the gate;
forming two doped regions in the substrate at both sides of the gate, wherein the first extension portion of each charge storage layer extends to over one of the doped regions, wherein a ratio of a length of the body portion to a length of the first extension portion ranges from 2:1 to 5:1; and
forming a word line to connect the gate of the memory device to a gate of another memory device and cover at least one of the two doped regions.

5. The method of claim 4, wherein
each charge storage layer further includes a second extension portion connected to the first extension portion and extending along the sidewall of the gate, and
an edge of the first extension portion protrudes from a sidewall of the second extension portion.

6. The method of claim 5, wherein the first extension portion and the second extension portion of each charge storage layer are located over one of the doped regions.

7. The method of claim 4, further comprising forming, before the charge storage layers are formed, a liner material layer covering a surface of the substrate, sidewalls of the gate dielectric, and a bottom, the sidewalls and an upper surface of the gate, such that after the charge storage layers are formed, an edge of the first extension portion of each charge storage layer protrudes out of the liner material layer on a sidewall of the gate.

8. The method of claim 7, wherein forming the charge storage layers comprises:
   forming, on the liner material layer, a charge storage material layer filling the gaps;
   forming a spacer material layer covering the charge storage material layer; and
   anisotropically etching the spacer material layer, the charge storage material layer and the liner material layer to exposes surfaces of the gate and the substrate, wherein the remaining spacer material layer, the remaining charge storage material layer and the remaining liner material layer serve as spacer layers, the charge storage layers and liner layers, respectively.

9. The method of claim 4, further comprising forming liner layers on the sidewalls of the gate, wherein the first extension portion of each charge storage layer protrudes out of a sidewall of one of the liner layers.

\* \* \* \* \*